US008296540B2

(12) United States Patent
Garlepp et al.

(10) Patent No.: US 8,296,540 B2
(45) Date of Patent: *Oct. 23, 2012

(54) METHOD AND APPARATUS FOR ADJUSTING THE PERFORMANCE OF A SYNCHRONOUS MEMORY SYSTEM

(75) Inventors: Bruno Werner Garlepp, Mountain View, CA (US); Pak Shing Chau, San Jose, CA (US); Kevin S. Donnelly, San Francisco, CA (US); Clemenz Portmann, Cupertino, CA (US); Donald C. Stark, Los Altos, CA (US); Stefanos Sidiropoulos, Stanford, CA (US); Richard M. Barth, Palo Alto, CA (US); Paul G. Davis, San Jose, CA (US); Ely K. Tsern, Los Altos, CA (US)

(73) Assignee: Rambus Inc., Sunnyvale, CA (US)

( * ) Notice: Subject to any disclaimer, the term of this patent is extended or adjusted under 35 U.S.C. 154(b) by 683 days.

This patent is subject to a terminal disclaimer.

(21) Appl. No.: 12/036,598

(22) Filed: Feb. 25, 2008

(65) Prior Publication Data
US 2008/0162759 A1    Jul. 3, 2008

Related U.S. Application Data

(63) Continuation of application No. 11/609,135, filed on Dec. 11, 2006, now Pat. No. 7,337,294, which is a continuation of application No. 10/386,210, filed on Mar. 10, 2003, now Pat. No. 7,149,856, which is a continuation of application No. 10/051,957, filed on Jan. 18, 2002, now Pat. No. 6,553,452, which is a continuation of application No. 08/948,774, filed on Oct. 10, 1997, now Pat. No. 6,513,103.

(51) Int. Cl.
*G11C 7/04* (2006.01)
*G01K 1/00* (2006.01)
*G01K 3/00* (2006.01)
*G01K 15/00* (2006.01)
*G01M 1/38* (2006.01)
*G06F 3/00* (2006.01)
*G06F 12/00* (2006.01)

(52) U.S. Cl. ........ 711/167; 365/211; 374/100; 374/103; 700/278; 702/99; 710/8; 711/104; 711/105; 711/154; 711/156

(58) Field of Classification Search ...... 710/8; 711/104, 711/105, 154, 156, 167, 170; 700/278; 374/100, 374/103; 365/211, 222; 702/99; 713/105
See application file for complete search history.

(56) References Cited

U.S. PATENT DOCUMENTS
4,338,569 A    7/1982   Petrich
(Continued)

FOREIGN PATENT DOCUMENTS
JP    0200003583    2/2000
(Continued)

OTHER PUBLICATIONS
"The Phase-Locked Loop," Internet Paper downloaded from http://yake.ecn.purdue.edu/-roos/modem/pll/pll.html. pp. 1-3. (*).
(Continued)

Primary Examiner — Kevin Ellis
Assistant Examiner — Mehdi Namazi
(74) Attorney, Agent, or Firm — Vierra Magen Marcus & DeNiro LLP

(57) ABSTRACT

A method and apparatus for adjusting the performance of a memory system is provided. A memory system comprises a master device and a slave device. A memory channel couples the master device to the slave device such that the slave device receives the system operating information from the master device via the memory channel. The slave device further includes tuning circuitry within the slave device such that the performance of the memory system is improved.

34 Claims, 5 Drawing Sheets

U.S. PATENT DOCUMENTS

| | | | |
|---|---|---|---|
| 4,691,124 A | | 9/1987 | Ledzius et al. |
| 4,884,041 A | | 11/1989 | Walker |
| 4,920,489 A | | 4/1990 | Hubelbank |
| 5,036,300 A | | 7/1991 | Nicolai |
| 5,180,994 A | | 1/1993 | Martin et al. |
| 5,303,191 A | | 4/1994 | Eagan et al. |
| 5,329,491 A | | 7/1994 | Brown et al. |
| 5,347,227 A | * | 9/1994 | Bortolini ................. 327/144 |
| 5,399,995 A | | 3/1995 | Kardontchik et al. |
| 5,422,806 A | * | 6/1995 | Chen et al. ................. 700/29 |
| 5,446,696 A | | 8/1995 | Ware |
| 5,451,894 A | | 9/1995 | Guo |
| 5,485,490 A | | 1/1996 | Leung |
| 5,490,059 A | * | 2/1996 | Mahalingaiah et al. ........ 700/46 |
| 5,506,815 A | | 4/1996 | Hsieh et al. |
| 5,513,327 A | | 4/1996 | Farmwald |
| 5,532,633 A | | 7/1996 | Kawai |
| 5,534,805 A | | 7/1996 | Miyazaki et al. |
| 5,550,783 A | | 8/1996 | Stephens et al. |
| 5,554,945 A | | 9/1996 | Lee |
| 5,563,928 A | * | 10/1996 | Rostoker et al. ................. 377/20 |
| 5,570,054 A | | 10/1996 | Takla |
| 5,614,855 A | | 3/1997 | Lee |
| 5,673,295 A | | 9/1997 | Read et al. |
| 5,712,883 A | | 1/1998 | Miller et al. |
| 5,712,884 A | | 1/1998 | Jeong |
| 5,721,837 A | * | 2/1998 | Kikinis et al. ................. 710/303 |
| 5,742,798 A | | 4/1998 | Goldrian |
| 5,745,792 A | | 4/1998 | Jost |
| 5,752,011 A | * | 5/1998 | Thomas et al. ................. 713/501 |
| 5,764,092 A | | 6/1998 | Wada et al. |
| 5,768,189 A | | 6/1998 | Takahashi |
| 5,784,328 A | | 7/1998 | Irrinki et al. |
| 5,799,051 A | | 8/1998 | Leung |
| 5,801,985 A | | 9/1998 | Roohparvar et al. |
| 5,838,578 A | * | 11/1998 | Pippin ......................... 327/512 |
| 5,870,614 A | * | 2/1999 | Ang ............................. 713/320 |
| 5,886,564 A | * | 3/1999 | Sato et al. ...................... 327/513 |
| 5,890,014 A | | 3/1999 | Long |
| 5,890,100 A | * | 3/1999 | Crayford ....................... 702/130 |
| 5,943,206 A | * | 8/1999 | Crayford ....................... 361/103 |
| 5,956,289 A | * | 9/1999 | Norman et al. ........... 365/233.1 |
| 5,959,481 A | * | 9/1999 | Donnelly et al. ............. 327/170 |
| 5,978,926 A | | 11/1999 | Ries et al. |
| 6,002,627 A | | 12/1999 | Chevallier |
| 6,131,073 A | * | 10/2000 | Honda et al. .................. 702/107 |
| 6,160,755 A | | 12/2000 | Norman et al. |
| 6,233,190 B1 | | 5/2001 | Cooper et al. |
| 6,249,155 B1 | * | 6/2001 | Hartman et al. ............... 327/106 |
| 6,337,589 B1 | | 1/2002 | Ooishi |
| 6,438,057 B1 | | 8/2002 | Ruckerbauer |
| 7,587,262 B1 | * | 9/2009 | Pippin ......................... 700/299 |
| 2002/0051396 A1 | * | 5/2002 | Higashiho et al. ............ 365/222 |
| 2003/0156483 A1 | * | 8/2003 | Feurle et al. ................. 365/222 |
| 2003/0212474 A1 | * | 11/2003 | Pippin ......................... 700/300 |
| 2004/0047099 A1 | * | 3/2004 | Pippin ......................... 361/103 |
| 2004/0181354 A1 | * | 9/2004 | Gauthier et al. ................. 702/99 |
| 2004/0227553 A1 | * | 11/2004 | Muranishi ..................... 327/231 |
| 2008/0162759 A1 | * | 7/2008 | Garlepp et al. ............... 710/110 |
| 2009/0046761 A1 | * | 2/2009 | Pan ............................. 374/178 |
| 2009/0129438 A1 | * | 5/2009 | Pan ............................. 374/170 |

FOREIGN PATENT DOCUMENTS

WO     WO 92/10032     *    7/1992

OTHER PUBLICATIONS

Lee, Thomas H., "A. 2.5 V CMOS Delay-Locked Loop for an 18 Mbit, 500 Megabyte/s DRAM," IEEE Journal, vol. 29, No. 12, Dec. 1994.

Microprocessor and Microcomputer Standards Subcommittee of the IEEE Computer Society, "Draft Standard for a High-Speed Memory Interface (SyncLink)," Draft 0.99 IEEE P1596.7-199X, pp. 1-66 (1996).

Tanoi et al., "A 250-622 MHz Deskew and Jitter-Suppressed Clock Buffer Using Two-Loop Architecture", IEEE Journal of Solid State Circuits, 31(4):487-493 (1996).

Gillingham, Peter, "SLDRAM Architectural and Functional Overview," SLDRAM Consortium, SLDRAM Inc., pp. 1-14 (Aug. 29, 1997).

Reese, Edmund A., et al., "A Phase-Tolerant 3.8GB/s Data-Communication Router for a Multiprocessor Supercomputer Backplane," ISSC94/Session 18/High-Performance Logic and Circuit Techniques/Paper FA 18.4, 1994 IEEE International Solid State Circuits Conference, 4 pgs.

Hatakeyama, et al., TP 4.5: A256Mb SDRAM Using a Register-Controlled Digital DLL, IEEE ISSCC Digest of Technical Papers, Feb. 6-8, 1997.

Sidiropoulos, Stefanos et al., "A Semi-Digital DLL With Unlimited Phase Shift Capability and 0.08-400 MHz Operating Range," 1997 IEEE Intn'l Solid State Circuits Conf., 5 pages.

Dehon, Andre, "In-System Timing Extraction and Control Through Scan-Based, Test-Access Ports," (original publication Jan. 1994), Internet Paper, downloaded from http://www.ai.mit.edu/projects/transit/tn102/.html#vcdl, pp. 1-19.

International Search Report, PCT/US98/02053, 5 pages.

* cited by examiner

METHOD AND APPARATUS FOR ADJUSTING THE PERFORMANCE OF A SYNCHRONOUS MEMORY SYSTEM

PRIORITY DATA

This application is a continuation of U.S. patent application Ser. No. 11/609,135 filed on Dec. 11, 2006, now U.S. Pat. No. 7,337,294, which is a continuation of U.S. patent application Ser. No. 10/386,210 filed on Mar. 10, 2003, now U.S. Pat. No. 7,149,856, which is a continuation of U.S. patent application Ser. No. 10/051,957 filed on Jan. 18, 2002, now U.S. Pat. No. 6,553,452, which is a continuation of U.S. patent application Ser. No. 08/948,774 filed on Oct. 10, 1997, now U.S. Pat. No. 6,513,103.

The present invention relates to digital memory systems, and more specifically, to synchronous memory systems.

BACKGROUND OF THE INVENTION

As the operational frequencies of digital computing systems continue to increase, it has become increasingly necessary to use synchronous memory systems instead of the slower asynchronous memory systems. In synchronous memory systems, data is sent between a master device and one or more memory devices in the form of data packets which travel in parallel with, and must maintain precise timing relationships with, a system clock signal.

Because synchronous memory systems impose tight timing relationships between the clock and data signals, the memory interface circuits in the memory devices of the synchronous memory system generally require clock recovery and alignment circuits such as phase locked loops (PLLs) or delay locked loops (DLLs). One drawback of these clock recovery and alignment circuits, however, is that they typically operate effectively only over a limited range of frequencies. For example, a PLL may not be able to lock to the system's clock frequency if the frequency is either too low or too high. Additionally, the performance of these clock recovery and alignment circuits is degraded due to conditions such as temperature, supply voltage, speed binning codes, process, dimensions (i.e. length) of the memory bus, etc.

SUMMARY OF THE INVENTION

It is an object of this invention to provide for an adjustable synchronous memory system.

It is a further object of this invention to provide for a synchronous memory system that uses frequency information to improve the performance of the circuits at the system clock frequency.

It is a further object of this invention to provide for a synchronous memory system that uses system parameters to improve the performance of the circuits at the system clock frequency.

The present invention is a method for adjusting the performance of a synchronous memory system. A memory system comprises a master device and a slave device. A memory channel couples the master device to the slave device such that the slave device receives the system operating information from the master device via the memory channel. The slave device further includes means for tuning circuitry within the slave device such that the performance of the memory system is improved.

Other objects, features, and advantages of the present invention will be apparent from the accompanying drawings and from the detailed description that follows below.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

A method and apparatus for adjusting the performance of a memory system is described. A synchronous memory system wherein the master device has information about its operating frequency and transmits this frequency information to the memory devices is described. The memory devices then use this frequency information to adjust their clock recovery and alignment circuits to improve their performance at the system clock frequency. The master device may send the memory devices information that specifies the exact frequency of operation, or alternatively, the master device may send the memory devices information that specifies a predetermined range of frequencies which includes the system's clock frequency. For one embodiment, the frequency information is sent as a digital code that is received, stored, and decoded by the memory devices to produce a control code for adjusting the performance of the clock recovery and alignment circuits.

The synchronous memory system operates by sending and receiving data in packets which are synchronized with respect to a system clock. In order to do this properly, the memory master as well as all the slave devices must include circuitry that ensures that the data is read/written synchronously with the system clock. This circuitry is placed within the interface circuits of the memory master and slave devices. The key function of this circuitry is to produce internal clock signals within each device that maintain the proper phase relative to that of the external system clock such that data read or written to the channel by each of the devices is done so at the correct time, thereby preserving synchronization in the memory system. Because the memory devices may be used in different systems which use different operating clock frequencies, this circuitry should function effectively over a large range of possible system clock frequencies.

Figure 1:
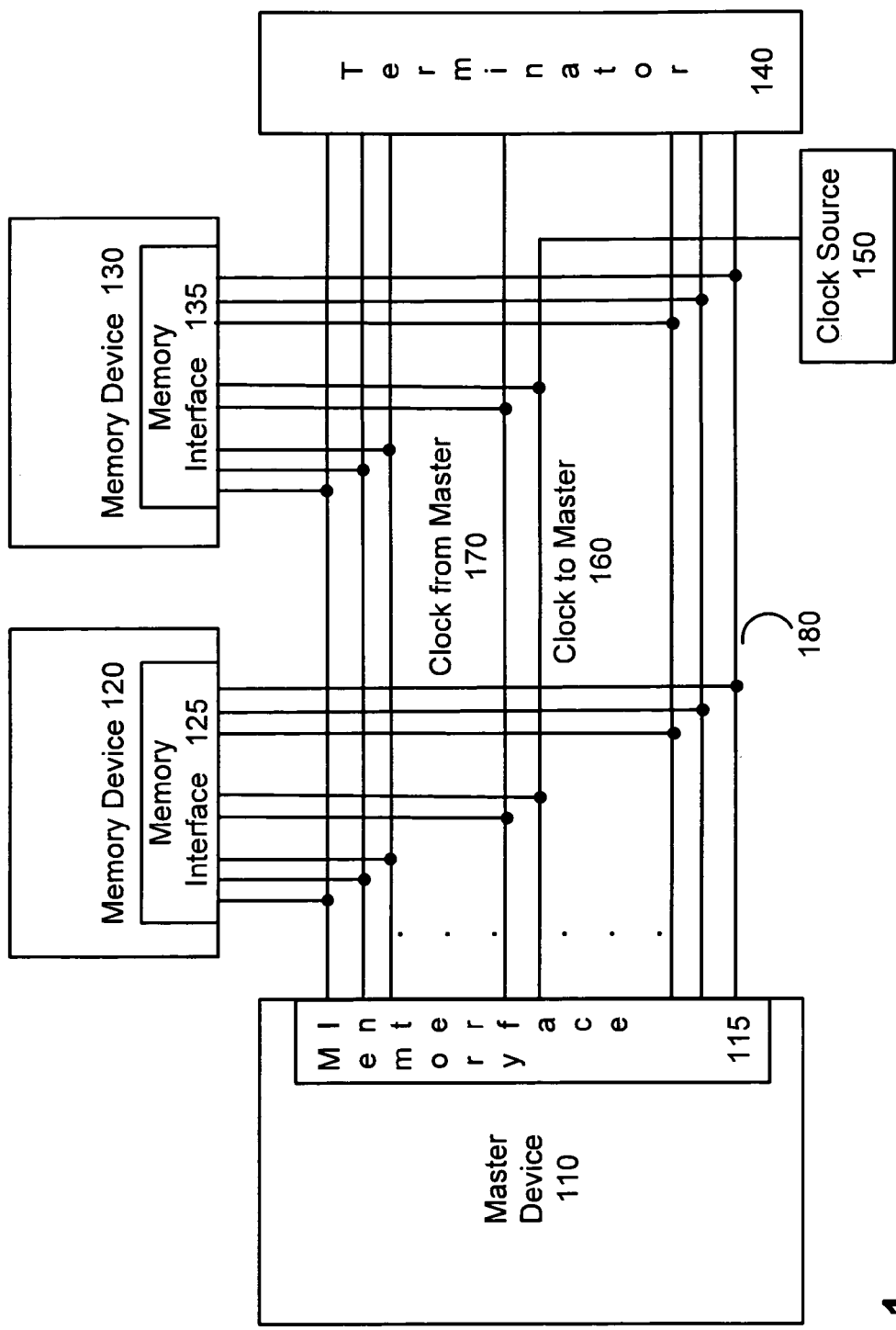
FIG. 1 illustrates one embodiment of the synchronous memory system of the present invention.

FIG. 1 illustrates one embodiment of the synchronous memory system of the present invention. This system comprises a master device 110, a memory bus 180, one or more memory devices 120, 130, a system clock source 150, and a terminator 140.

The master device 110 can be a memory controller, a microprocessor, a 3-D firmware chip, or any other microchip that accesses the synchronous memory. The master device 110 includes a memory interface circuit 115 for transmitting and receiving data from the memory bus 180. The master device 110 generates requests to store data into or recover data from the memory devices 120, 130 via the memory bus 180.

The memory bus 180 is a data communications channel. For one embodiment, the memory bus 180 is a collection of wires or transmission lines. For one embodiment, the memory bus 180 comprises matched-impedance printed circuit board traces.

For one embodiment, the memory devices 120, 130 are dynamic random access memories (DRAMs). Alternatively, the memory devices 120, 130 are static random access memories (SRAMs) or other memory devices. Each memory device 120, 130 includes a memory interface circuit 125, 135, respectively, for transmitting and receiving data from the memory bus 180. For one embodiment, the memory devices 120, 130 cannot generate requests for data but instead only respond to requests generated by the master device 110.

The clock source 150 provides the synchronizing clock signal for the memory system at a system clock frequency. In FIG. 1, the clock source 150 is shown providing this clock signal to a signal line called CTM 160 (clock-to-master). In this implementation, the clock signal travels along the memory bus 180 from the clock source 150, past all the memory devices 120, 130, to the master device 110. At the master device 110, CTM 160 connects to another signal line called CFM 170 (clock-from-master). Thus, the clock signal travels back along the memory bus 180 in the opposite direction, away from the master device 110, past all the memory devices 120, 130 and to the terminator 140. Data sent from the master device 110 to the memory devices 120, 130 travels in parallel with the clock signal on CFM 170. Likewise, data sent from the memory devices 120, 130 to the master device 110 travels in parallel with the clock signal of CTM 160.

The terminator 140 provides a matched-impedance termination for the transmission lines of the memory bus 180. For one embodiment, all signals transmitted on the memory bus 180 eventually terminate at the terminator 140. Although it is included in the synchronous memory system of FIG. 1, some synchronous memory systems do not use a terminator 140. For one embodiment, the terminator 140 is a plurality of resistors, coupled to the memory bus 180, preventing reflection of the signal.

Figure 2:
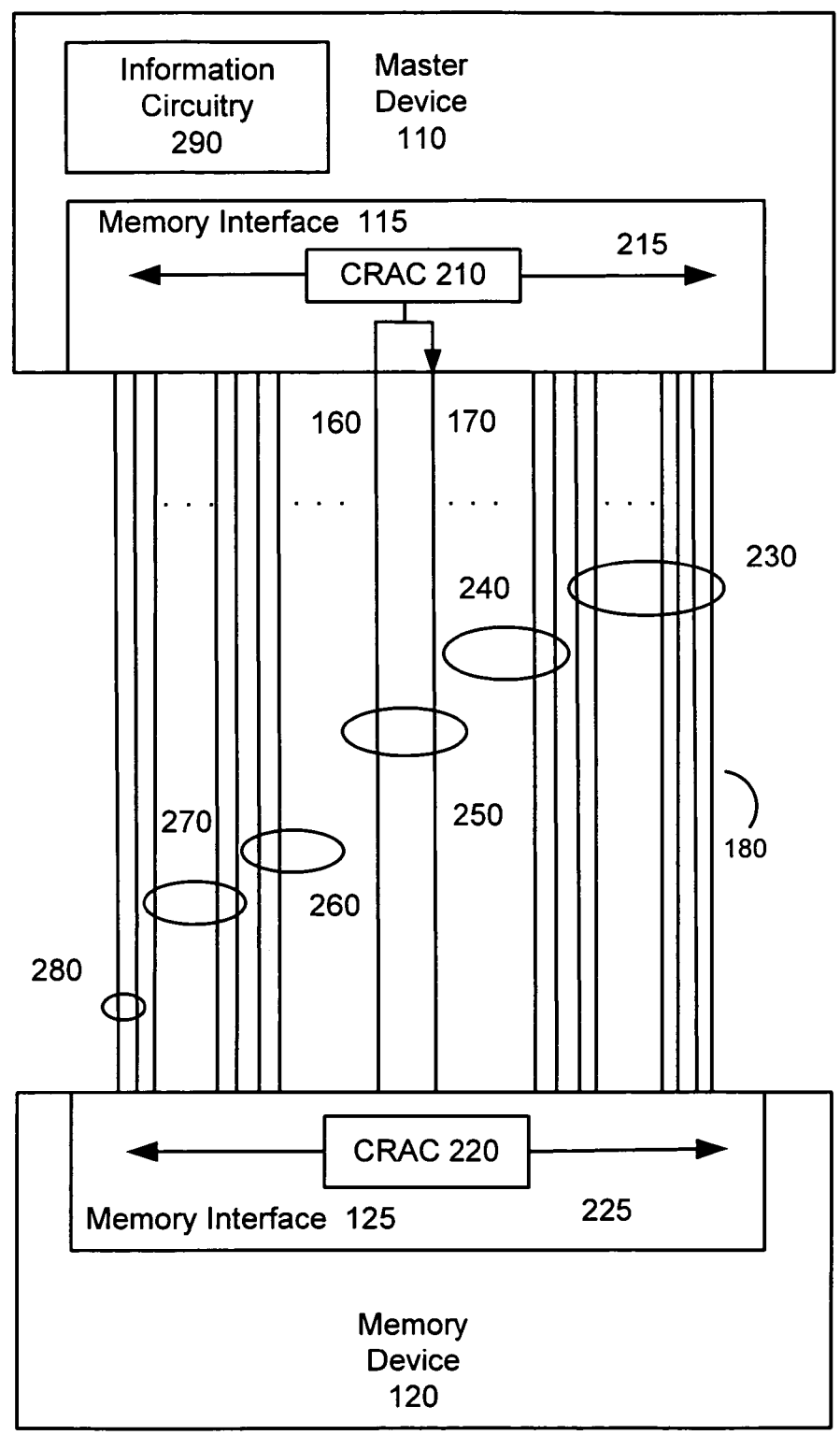
FIG. 2 illustrates a portion of the synchronous memory system of FIG. 1.

FIG. 2 shows a more detailed drawing of a portion of a synchronous memory system. In order to show more detail, only the master device 110, one memory device 120, and the portion of the memory bus 180 that connects these two devices is shown. FIG. 2 shows the memory interface circuits 115, 125 for both the master device 110 and the memory device 120. Furthermore, the figure shows the clock recovery and alignment circuits 210, 220 (CRA circuits) within the interface circuits 115, 125, respectively. FIG. 2 also shows the internal clock lines 215, 225 which are driven by the CRA circuits 210, 220. These internal clock lines 215, 225 serve to synchronize the receive and transmit circuitry in the memory interface circuit 115, 125 to the system clock signals.

The master device 110 further includes information circuitry 290. The information circuitry holds information about the system's clock frequency and other system-level information. For one embodiment, the information circuitry 290 holds system clock frequency information. The information circuitry 290 may detect and/or store other information which affects circuit functioning. For one embodiment, the information circuitry 290 may detect and/or store information about the system temperature, or temperature ranges. The information circuitry 290 may detect and/or store information about the supply voltage, or voltage range. The information circuitry 290 may further detect and/or store information about the length of the memory bus 180, speed binning codes, process, and other factors that may affect the operation of the memory system. For one embodiment, the information circuitry 290 includes a PVTR detector. Detecting and storing this type of information is known in the art, as is the influence of the various factors on system operation. For one embodiment, the data in the information circuitry is also used to tune the performance of the CRA circuit 210 in the master device's memory interface 115.

For one embodiment, the same information about frequency, voltage, temperature, etc. that is sent to the memory devices to tune the performance of their CRA circuits is also made available to a CRA circuit inside the master device to tune its performance. Chip-specific information about the master device, such as the master device's process condition may be used along with the information that is sent to the memory devices to tune the performance master device's CRA circuit.

The master device 110 uses the memory bus 180 to access data and control the memory device 120. The master device 110 improves the performance of the CRA circuits in the memory device 120 by sending frequency information though the memory bus 180 to the memory device 120. For one embodiment, the frequency information is sent as a digital code to the memory device 120. Alternatively, for more accuracy, the frequency information may be sent as an analog signal.

FIG. 2 also shows the memory bus 180 in greater detail. The signal lines shown in FIG. 2 illustrate the types of signal lines present, in one embodiment. However, the number of signal lines illustrated do not correspond to the actual number of signal lines. The memory bus 180 includes the clock signal lines 250, CTM 160 and CFM 170, described above.

For one embodiment, the memory bus 180 includes a plurality of high-speed data lines 230, 270 which transmit data information between the master device 110 and the memory device 120 in parallel with either the CTM 160 or CFM 170 clock signals. The memory bus 180 also includes a plurality of high-speed control signal lines 240, 260 for transmitting address, request, acknowledge, and other control signals. Finally, the memory bus 180 includes lower-frequency "sideband" lines 280 for communicating information at lower speed between the master device 110 and the memory device 120.

For one embodiment, the memory channel includes slow speed lines and high speed lines. For one embodiment, the slow speed lines are used for system control such as nap, and the high speed lines are used for data and addressing. The controller is aware of its operating frequency and communicates this information to the slave devices. For one embodiment, the master device communicates this information to the slave devices via the slow speed lines. The slave devices receive, decode, and use this frequency information to adjust the circuits in their CRA circuits to improve their performance at the system clock frequency and other operating conditions. In other words, frequency control information comes down the slow speed lines to adjust/improve the performance of the high speed lines. For an alternative embodiment, there is only one channel that operates first at low speed to send frequency control information to adjust the CRA circuits and then operates at high speed after adjustment. For another alternative embodiment, there is only one channel that always operates at high speed, but until the frequency control information has been sent, it operates with lower initial margin.

For one embodiment, the master device 110 sends the memory device 120 information that specifies the exact frequency of operation. For another embodiment, the master device 110 sends the memory device 120 information that specifies a predetermined range of frequencies which includes the system's clock frequency.

For one embodiment, the master device further includes a PVTR detector, and the information circuit 290 further sends information from this PVTR circuit to the slave devices. In one embodiment, the master has a PVTR detector or other detector for detecting system operating parameters. The master sends this information to the slave devices so that they can adjust their performance. This data can be sent via any of the 3 ways described above, i.e. over a separate slow speed channel, over a temporarily slow speed channel, or over an initially low margin high speed channel.

In an alternative embodiment, each individual slave device has a PVTR detector to control the performance of its own CRA circuits.

In yet another embodiment, the master sends frequency information to the slaves, but each slave also has its own PVTR detector. The frequency data is combined with the PVTR data to properly adjust the CRA circuits to account for both of these two types of operating information.

For one embodiment, such information is sent to the memory device 120 periodically during operation of the memory system. For another embodiment, the information is sent only once, during initialization of the memory system.

Figure 3:
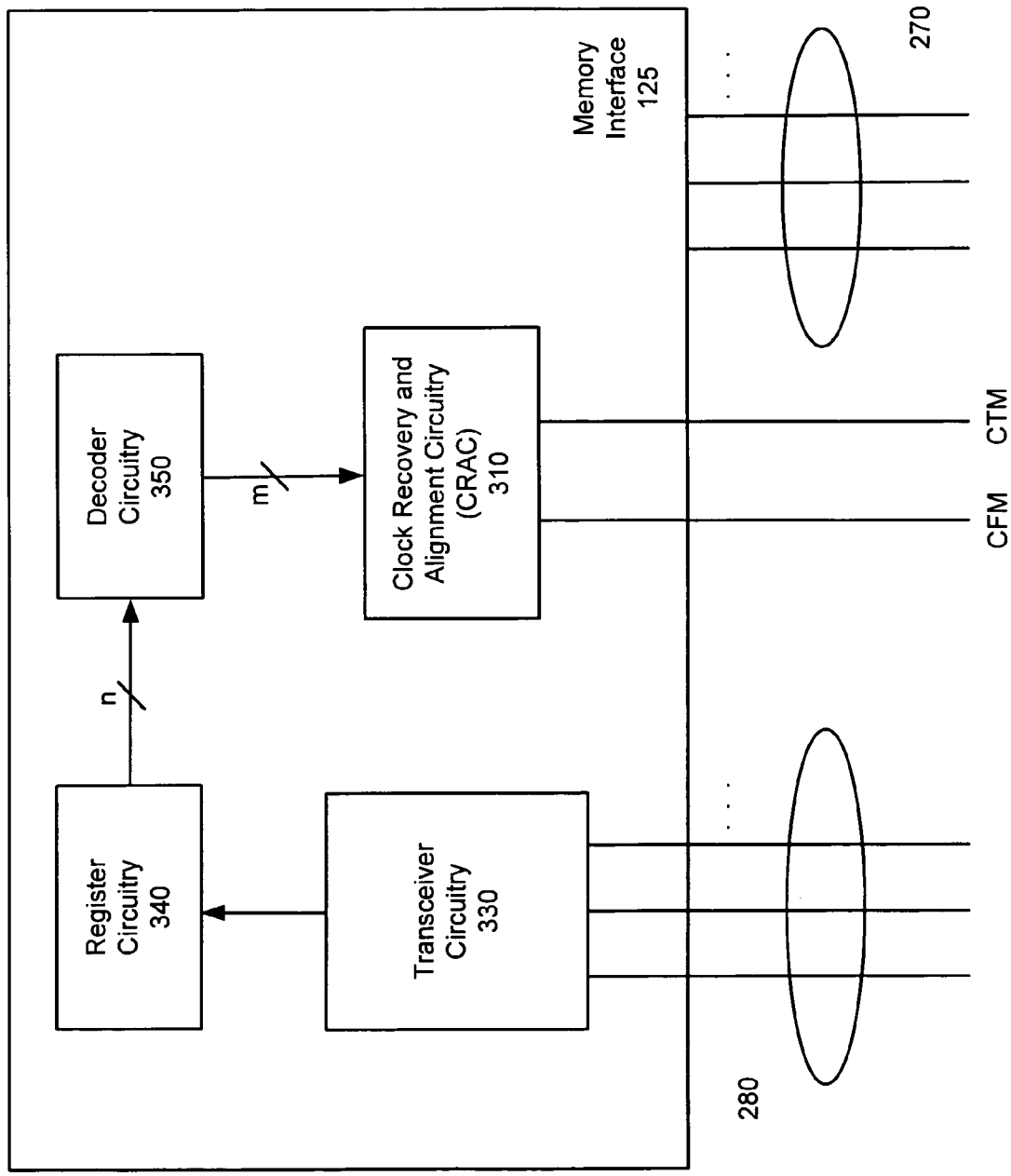
FIG. 3 illustrates one embodiment of the memory interface circuitry inside a memory device of the present invention.

FIG. 3 shows a close-up view of one embodiment the memory interface circuitry 125 inside a memory device 120 of the present invention. The memory interface circuitry 125 includes a clock recovery and alignment circuit 310 (CRA circuit), transceiver circuitry 330, an n-bit wide register circuit 340, and an m-bit wide decoder circuitry 350. The transceiver circuitry 330 is designed to receive data from and/or transmit data to the memory bus 180. The m-bit wide decoder circuitry 350 is designed to decode the frequency information sent by the master device 110 and stored in the register circuit 340 to produce a corresponding m-bit control code.

The master device 110 (not shown) sends the information about the system's operating frequency to the memory device 120. The frequency information is encoded onto n bits as described below. This frequency information is then received by the transceiver circuitry 330 in each memory device 120. The use of transceiver circuitry 330 for receiving data from the memory bus 180 is well-known in the art. Upon receiving this information about the system's clock frequency, the transceiver circuitry 330 stores it into the n-bit register circuit 340. For one embodiment, the frequency information is stored in the register circuit 340 during normal system operation or at the initialization of the system.

The n-bit register circuit 340 presents this frequency information to a decoder circuitry 350. The decoder circuitry 350 translates this frequency information into a m-bit control code for adjusting the performance of the CRA circuitry 310. For one embodiment, the control code is used to adjust one or more portions of the CRA circuitry 310 such that the circuitry operates effectively at the system's clock frequency. For another embodiment, the control code adjusts the CRA circuitry 310 to optimize for external factors, such as temperature, memory bus 180 length, supply voltage, etc. There are several ways that the frequency information can be encoded into n bits and then sent to and stored in the memory device 120. For one embodiment, a binary word indicates the time period of the system clock in pico-seconds (ps), where period=1/frequency. For example, using a 16-bit register, a 16-bit digital word can be sent to the memory device 120 that indicates with 1 ps precision that the system's clock period is anywhere from 0 ps to 65,535 ps ($2^{16}$-1). Alternatively, a more compact digital code that indicates one of a predetermined range of frequencies which includes the system's clock frequency may be used. This scheme requires the storage of fewer bits than the first scheme, but only specifies a range of frequencies instead of an exact frequency. One example of a compact code that could be used, and its corresponding range of frequencies, is shown in the table below:

TABLE 1

Code Indicating Frequency Range

| Compact Code Bits | | Minimum Frequency | Maximum Frequency | Frequency Range Size |
|---|---|---|---|---|
| C1 | C0 | (fmin) | (fmax) | (Delta_F) |
| 0 | 0 | 238 MHz | 282 MHz | 44 MHz |
| 0 | 1 | 278 MHz | 327 MHz | 49 MHz |
| 1 | 0 | 323 MHz | 382 MHz | 59 MHz |
| 1 | 1 | 378 MHz | 447 MHz | 69 MHz |

As can be seen, this scheme uses only 2 bits instead of 16 bits.

In one embodiment, a subset of the n-bit register is implemented. The number of bits used may be restricted to the minimum number needed for the applicable frequency range. For example, the full range of frequencies may use 16-bits, specifying a range of frequencies from 0 ps to 65,535 ps. One embodiment may implement 12-bits, limiting the range of frequencies from 0 ps to 4069 ps, if that is sufficient for the system application in question. For one embodiment, a similar method can be implemented for an encoded frequency information. Reducing the number of bits used reduces the circuitry needed to store and decoder the information, and thus reduces the cost of the device.

Once the frequency information has been stored in the n-bit register circuit 340, the decoder circuitry 350 evaluates this n-bit data to produce the required m-bit control code for adjusting the CRA circuitry 310 for optimal operation. For one embodiment, the control code that is decoded from the frequency information specifies a range of operating frequencies. This is simple if the register circuit 340 is given a compact code that specifies a range of frequencies which includes the system's clock frequency. The decoder circuitry 350 is more complex if the register circuit 340 holds the period of the system's clock signal. For one embodiment, the decoder circuitry 350 includes a simple look-up table for frequency ranges corresponding to control codes. For one embodiment, these tables are hard wired. For one embodiment, these tables may be altered by a user. The decoded control code is then sent to the CRA circuit 310.

The CRA circuit 310 adjusts the phase of internal clock signals so that the receive and transmit circuitry of the memory device 120 will be synchronized with the system clock signals CTM & CFM. The CRA circuit 310 may include variable delay elements, phase interpolator (mixer) circuits, and slew rate control circuits. By receiving and responding to these control codes, these circuits enable the synchronous memory system to operate effectively over a larger range of system clock frequencies than would be possible without the control codes. For one embodiment, the CRA circuit 310 is a phase locked loop (PLL) circuit. For another embodiment, the CRA circuit 310 is a delay-locked loop (DLL) circuit.

The control codes are used to adjust the locking frequency range of the clock recovery and alignment circuits to include the operating clock frequency of the system. The control codes are also used to reduce the jitter of the signals on the high-speed lines, and to improve the timing margin of the signals on the high-speed lines.

Figure 4:
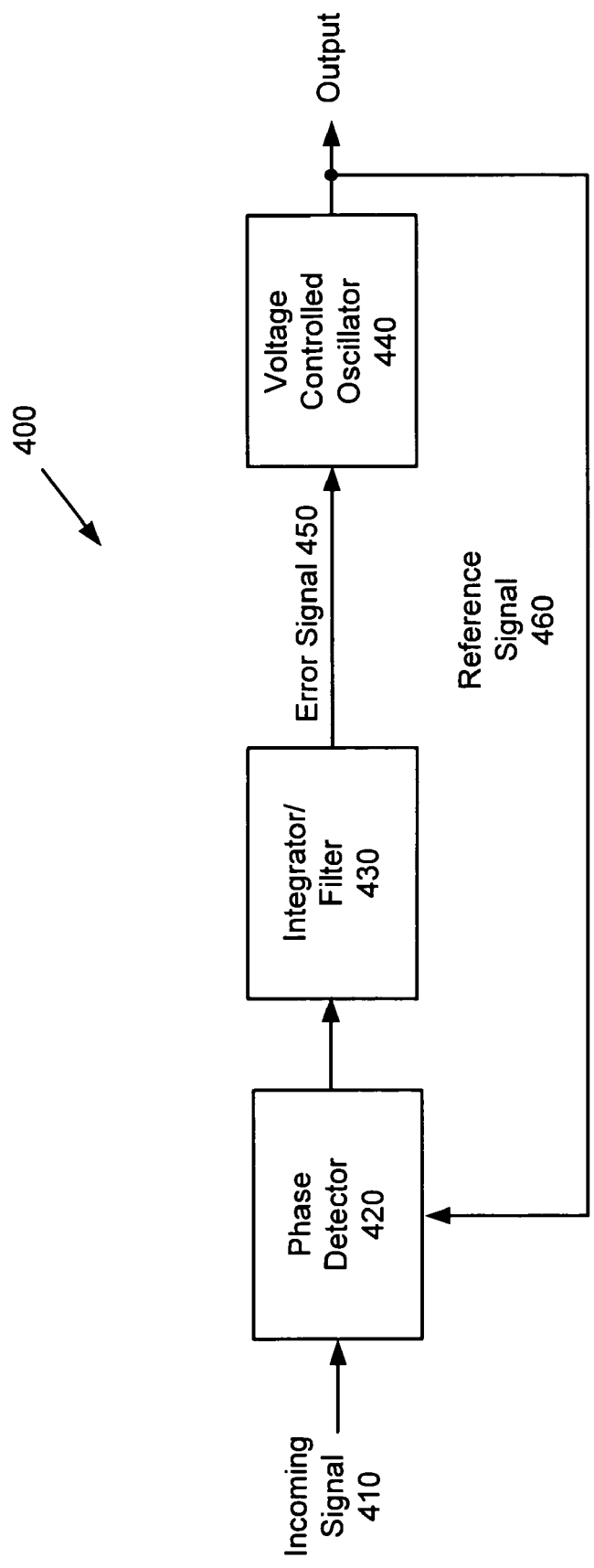
FIG. 4 illustrates a block diagram of one embodiment of a phase locked loop (PLL) circuit that may be used in the present invention.

FIG. 4 illustrates a block diagram of one embodiment of a phase locked loop (PLL) circuit. The phase locked loop 400 is a feed back device that attempts to lock to the phase of an incoming signal. The phase detector compares the phase of the incoming signal 410 to that of the reference signal 460. The reference signal 460 is the output of the PLL 400, and it also serves as the feedback signal for the PLL system.

An input signal 410 is an input to the phase detector 420. For one embodiment, the input signal 410 is a system clock signal such as CTM. The output of phase detector 420 is an input to integrator/filter 430. The output of integrator/filter 430 is input to a voltage controlled oscillator (VCO) 440. The output of the VCO 440 is the output of the phase locked loop 400. The output of the VCO 440 is the reference signal 460, which is input to the phase detector 420.

An example of how the phase locked loop works is as follows. At the beginning the loop is in balance, i.e. the loop error is equal to zero. Assume that the frequency of the incoming signal increases slightly. This means that the phase of that signal changes a little faster—phase is the integral of frequency. Accordingly, the loop error becomes positive because the phase of the reference signal cannot change at once due to inherent delays in the PLL 400. The frequency generated by the VCO 440 follows the changes in the error signal so that it also increases. The final consequence is that an increase in the incoming signal's frequency causes an increase in the frequency of the reference signal. Thus, the reference signal 410 and incoming signal 410 converge on the same frequency. The elements of the PLL 440 are known in the art.

Figure 5:
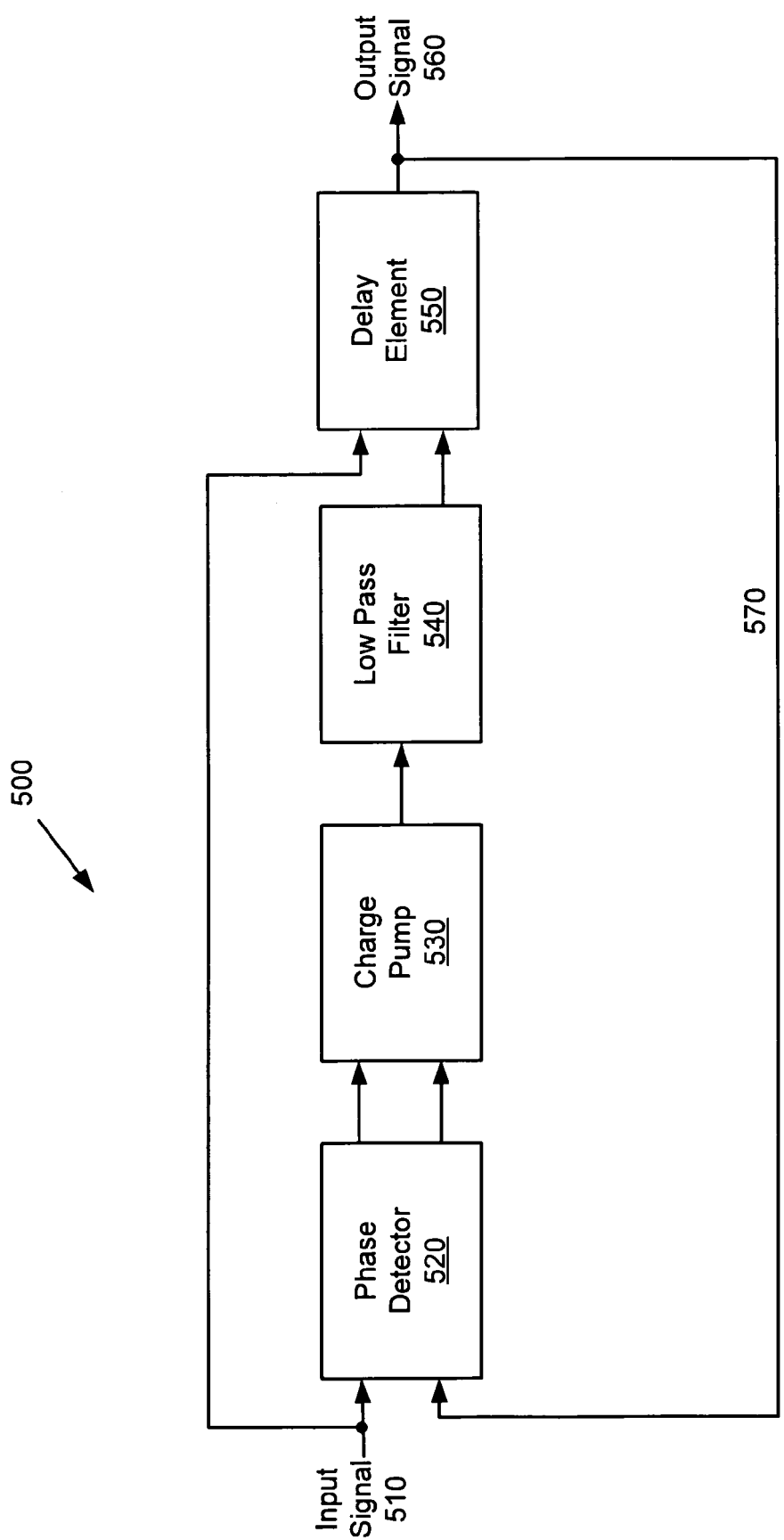
FIG. 5 illustrates a block diagram of one embodiment of a delay locked loop (DLL) circuit that may be used in the present invention.

FIG. 5 illustrates a block diagram of one embodiment of a delay locked loop (DLL) circuit that can be used in the CRA circuit. An input signal is placed on input line 510 of the delay locked loop 500. The input signal is also an input to the delay element 550. The phase detector 520 functions to compare the phase difference between the input signal 510, and a feedback signal on feedback loop 570, and to generate two possible outputs, up, and down, representing the phase difference between the input signal and the feedback signal. The up and down signal outputs of the phase detector 520 are input to a charge pump 530. The charge pump is controlled by the up and down signals to raise or lower the voltage on its output line. The voltage on the output line is an input to a low pass filter 540, where it is filtered and delivered to delay element 550. The delay element 550 functions to delay the input signal, in proportion to the voltage delivered by the low pass filter 540. This delayed signal is the output signal on line 560, and is fed back to the phase detector 520 via the feedback line 570.

Although this disclosure has stressed the use of frequency information to tune the clock recovery and alignment circuit of the memory device 120, other relevant information could be transmitted to the memory device 120 and held by its register circuit 340 to tune the performance of clock recovery and alignment circuits. Examples of other types of information that could be sent from the master to the memory device 120 are temperature, supply voltage, speed binning codes, dimensions of the memory bus 180, etc. Any one or more of these types of information could be sent from the master device 110 to the memory device 120 to tune the memory device 120 circuits to operate more effectively under the system's operating conditions.

In the foregoing specification, the invention has been described with reference to specific exemplary embodiments. It will, however, be evident that various modifications and changes may be made without departing from the broader spirit and scope of the invention as set forth in the claims. The specification and drawings are, accordingly, to be regarded in an illustrative rather than a restrictive sense.

The invention claimed is:

1. An integrated circuit, comprising:
   a temperature sensor to output a value that represents a temperature of the integrated circuit;
   a register to receive and store the value that represents the temperature of the integrated circuit;
   a decoder to output a control signal in response to the value that represents the temperature of the integrated circuit; and
   an adjustment circuit to adjust a clock signal in response to the control signal.

2. The integrated circuit of claim 1, wherein:
   the integrated circuit further comprises a bus interface; and
   wherein the bus interface is adapted to communicate with a data communications bus in response to the adjustment circuit at a rate determined by the clock signal as adjusted by the adjustment circuit.

3. The integrated circuit of claim 2, wherein the data communications bus is an external data communications bus, the master device thereby adapted to control data communications external to the integrated circuit in a manner influenced by the adjustment circuit.

4. The integrated circuit of claim 1, wherein the master device includes a system controller.

5. The integrated circuit of claim 4, wherein the system controller includes a memory system controller.

6. The integrated circuit of claim 1, further comprising an interface to output an adjustment signal, in response to the value that represents the temperature of the integrated circuit, to a slave device.

7. The integrated circuit of claim 1, wherein the adjustment circuit is adapted to modify operating frequency of at least one component within the integrated circuit based on the value that represents temperature of the integrated circuit.

8. The integrated circuit of claim 1, wherein:
   the adjustment circuit further comprises a clock recovery and alignment circuit; and
   the adjustment circuit is adapted to at least partially control the clock recovery and alignment circuit in response to the control signal.

9. The integrated circuit of claim 1, wherein the decoder translates the value that represents the temperature of the integrated circuit to control information represented by the control signal.

10. A method comprising:
    obtaining information that represents a temperature of an integrated circuit;
    storing the information that represents the temperature of the integrated circuit into a register;
    decoding the value that represents the temperature of the integrated circuit to a control signal; and
    adjusting a clock signal in response to the control signal to obtain an adjusted clock signal.

11. The method of claim 10, wherein the method is performed in an integrated circuit and the integrated circuit includes an interface adapted to be coupled to an external data path.

12. The method of claim 11, further comprising:
    transferring data at the interface in response to the adjusted clock signal.

13. The method of claim 12, wherein the external data path is a data communications bus, wherein the integrated circuit is configured as a master device that transfers the data to an integrated circuit memory device via the data communication bus.

14. The method of claim 10 wherein the obtaining includes measuring the temperature of a circuit component to obtain the information that represents the temperature of the integrated circuit.

15. The method of claim 14, wherein the measuring is performed by a temperature sensor.

16. The method of claim 10, further comprising generating the clock signal from a clock source.

17. The method of claim 16, further comprising:
transferring write data to be stored in an integrated circuit memory device; and,
wherein the transferring of the write data is synchronized with the adjusted clock signal.

18. The method of claim 10, wherein the decoding includes translating the value that represents the temperature of the integrated circuit to control information represented by the control signal.

19. An integrated circuit device, comprising:
a receiver to receive information representing a power supply parameter;
a storage circuit to store information representing the power supply parameter and information representing an operating frequency; and
an adjustment circuit to adjust a circuit based on the information representing the power supply parameter and information representing the operating frequency.

20. An integrated circuit device, comprising:
an internal detector circuit to detect a supply voltage;
a storage circuit to store information representing the supply voltage and information representing an operating frequency; and
an adjustment circuit to adjust a circuit based on the information representing the supply voltage and information representing the operating frequency.

21. The integrated circuit device of claim 19, wherein the integrated circuit device is an integrated circuit master device.

22. The integrated circuit device of claim 21, embodied within a memory system including a plurality of integrated circuit memory devices.

23. A memory controller, comprising:
a storage circuit to store information representing a clock parameter and information representing a temperature;
an adjustment circuit to adjust a circuit based on the information representing the clock parameter and information representing the temperature; and
a circuit to output the information representing the clock parameter to at least one integrated circuit memory device.

24. The integrated circuit device of claim 23, wherein the clock parameter is selected from at least one of a clock frequency, a clock phase, a clock delay and a slew rate.

25. An apparatus, comprising:
a temperature sensor to obtain information representing a temperature of a circuit in the apparatus;
a clock generator to provide a clock signal used for data communications;
a storage circuit to store information representing at least one of a plural operating parameters and the information representing the temperature; and
a clock alignment circuit to adjust the clock signal using at least one operating parameter represented by the information in response to the information representing the temperature, and the clock alignment circuit to output the clock signal to at least one integrated circuit memory device.

26. The apparatus of claim 25, wherein at least one of the operating parameters is a clock frequency.

27. The apparatus of claim 25, wherein at least one of the operating parameters is a clock phase.

28. The apparatus of claim 25, wherein at least one of the operating parameters is a clock delay.

29. The apparatus of claim 25, wherein at least one of the operating parameters is a slew rate limit.

30. The apparatus of claim 25, further comprising a master device.

31. The apparatus of claim 30, wherein the master device is an integrated circuit memory controller adapted to output the information representing at least one of the plural operating parameters and the temperature to at least one integrated circuit memory device.

32. The apparatus of claim 31, wherein the temperature sensor is external to the integrated circuit memory controller.

33. The apparatus of claim 25, wherein the clock generator receives a master clock signal from an external source and derives the clock signal from the master clock signal.

34. The apparatus of claim 25, wherein the clock alignment circuit is embodied in a master device that includes an integrated circuit memory controller.

* * * * *